(12) United States Patent
Hsieh

(10) Patent No.: US 8,829,607 B1
(45) Date of Patent: Sep. 9, 2014

(54) FAST SWITCHING SUPER-JUNCTION TRENCH MOSFETS

(71) Applicant: Force Mos Technology Co., Ltd., New Taipei (TW)

(72) Inventor: Fu-Yuan Hsieh, New Taipei (TW)

(73) Assignees: Fu-Yuan Hsieh, New Taipei (TW); Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/950,692

(22) Filed: Jul. 25, 2013

(51) Int. Cl.
*H01L 29/36* (2006.01)
*H01L 29/94* (2006.01)
*H01L 31/062* (2012.01)
*H01L 31/113* (2006.01)
*H01L 31/119* (2006.01)
*H01L 29/78* (2006.01)

(52) U.S. Cl.
CPC .................................. *H01L 29/7827* (2013.01)

USPC ........... 257/330; 257/329; 257/331; 257/332; 257/334

(58) Field of Classification Search
CPC ............ H01L 29/7802; H01L 29/7813; H01L 29/4236
USPC .......... 257/329, 330, 331, 332, 334, E29.257, 257/E21.384, E29.262, E21.41
See application file for complete search history.

(56) References Cited

U.S. PATENT DOCUMENTS 8,575,690 B1 * 11/2013 Hsieh ............................ 257/334
2009/0072301 A1 * 3/2009 Bhalla et al. .................. 257/328

* cited by examiner

*Primary Examiner* — Thien F Tran
(74) *Attorney, Agent, or Firm* — Bacon & Thomas, PLLC

(57) ABSTRACT

A fast switching super-junction trench MOSFET is disclosed having a floating region formed underneath each gate trench and surrounding at least bottom of each the gate trench, which has a parasitic body diode with superior reverse recovery characteristics.

18 Claims, 22 Drawing Sheets

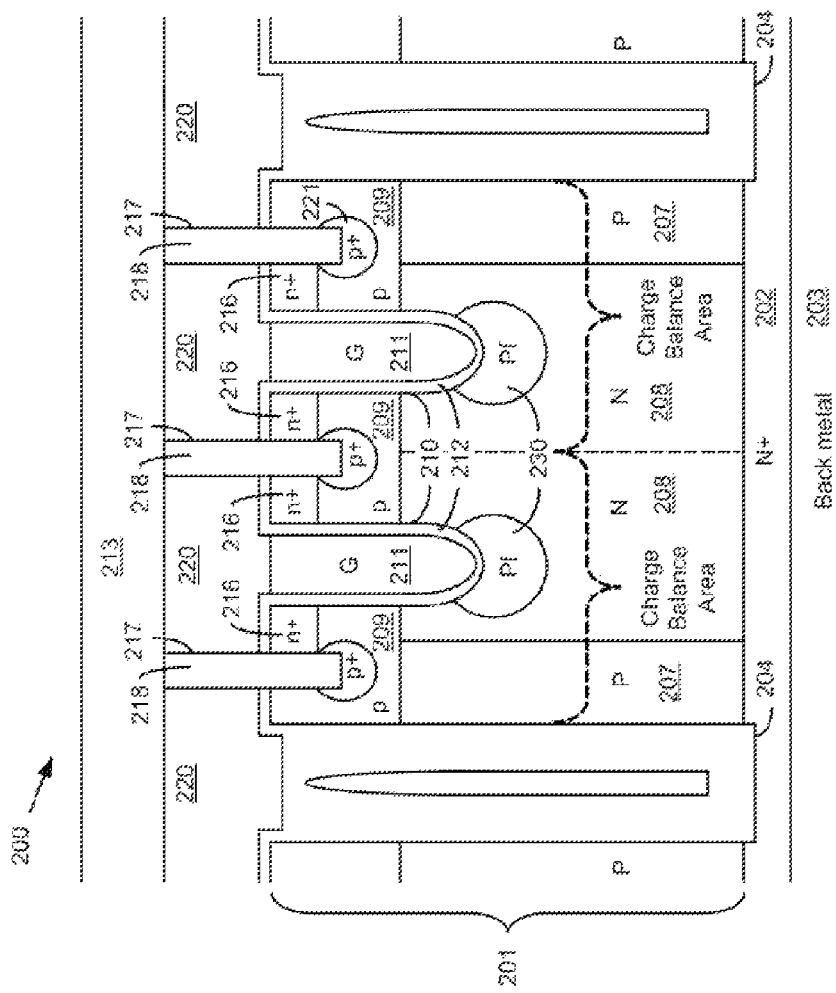

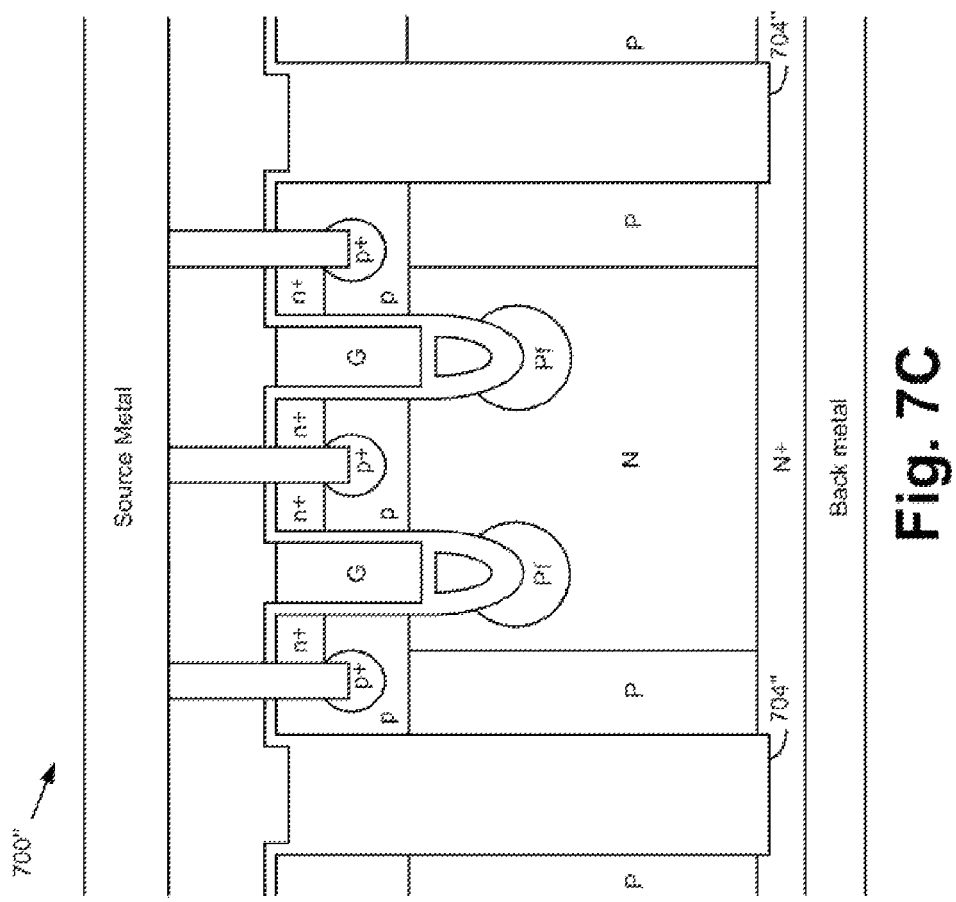

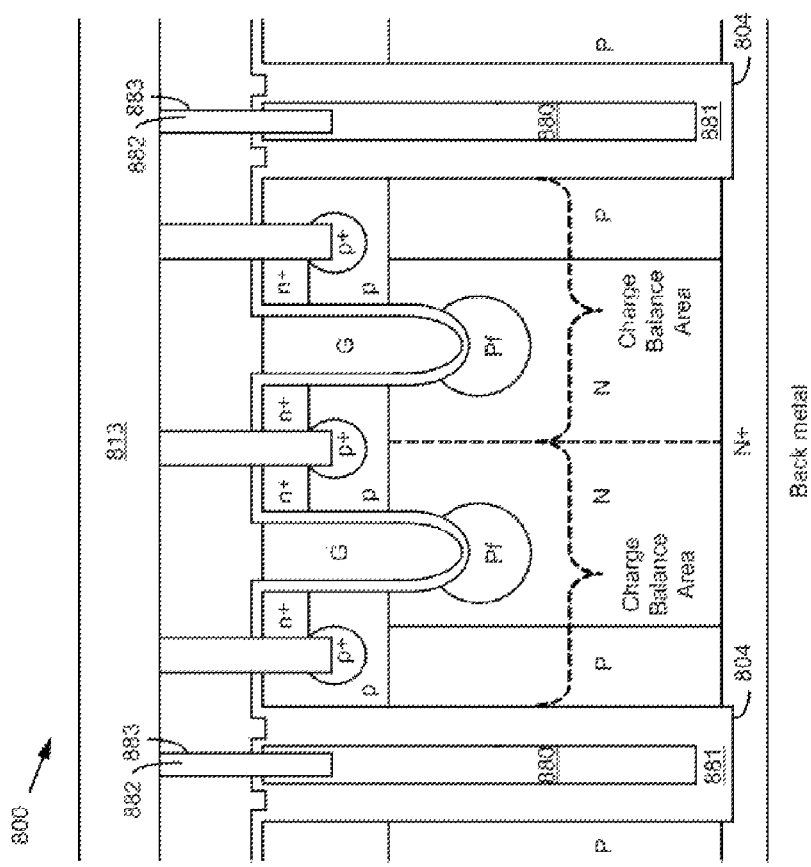

US 8,829,607 B1

FAST SWITCHING SUPER-JUNCTION TRENCH MOSFETS

CROSS REFERENCE TO RELATED APPLICATIONS

This application is a Continuation-In-Part (CIP) of U.S. patent application Ser. No. 13/751,458 of the same inventor, filed on Jan. 28, 2013, entitled "SUPER-JUNCTION TRENCH MOSFET HAVING DEEP TRENCHES WITH BURIED VOIDS".

FIELD OF THE INVENTION

This invention relates generally to the cell structure and device configuration of power semiconductor devices. More particularly, this invention relates to a novel and improved cell structure and device configuration of a super-junction trench metal oxide semiconductor field effect transistor (MOSFET, the same hereinafter).

BACKGROUND OF THE INVENTION

Compared with the conventional trench MOSFETs, super-junction trench MOSFETs are more attractive due to higher breakdown voltage and lower specific Rds (drain-source resistance). As is known to all, a super-junction trench MOSFET is implemented by p type column structures and n type column structures arranged in parallel and connecting to each other onto a heavily doped substrate, however, the manufacturing yield is not stable because the super-junction trench MOSFET is very sensitive to the fabrication processes and conditions such as: the p type column structures and the n type column structures dopant re-diffusion issue induced by subsequent thermal processes; trapped charges within the column structures, etc. All that will cause a hazardous condition of charges imbalance to the super-junction trench MOSFETs. More specifically, these undesired influences become more pronounced with a narrower column structure width for a lower bias voltage ranging under 200V.

U.S. Pat. No. 7,601,597 disclosed a method to avoid the aforementioned p type column structure and the n type structure dopant re-diffusion issue, for example in an N-channel trench MOSFET as shown in FIG. 1A, by setting up the p type column formation process at a last step after all diffusion processes such as: sacrificial oxidation after trench etch, gate oxidation, P body region formation and n+ source region formation, etc., have been finished.

However, the disclosed method of this prior art is not effective because that, firstly, the p type column structure is formed by growing an additional p type epitaxial layer in deep trenches etched in an n type epitaxial layer; secondly, an additional CMP (Chemical Mechanical Polishing) is required for surface planarization after the p type epitaxial layer is grown; thirdly, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Prior arts (paper "Industrialization of Resurf stepped oxide technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yant, etc.) disclosed device structures in order to resolve the limitation caused by the conventional super junction trench MOSFET discussed above, as shown in FIG. 1B and FIG. 1C. Both the device structures in FIG. 1B and FIG. 1C can achieve a lower specific Rds and a higher breakdown voltage than a conventional super junction trench MOSFET because each the epitaxial layer formed in FIG. 1B and FIG. 1C has a higher doping concentration than the conventional super junction trench MOSFET.

Refer to FIG. 1B and FIG. 1C again, both the device structures have a deep trench with a thick oxide layer along trench sidewalls and bottoms into a drift region. Only difference is that, the device structure in FIG. 1B has a single epitaxial layer (N Epi, as illustrated in FIG. 1B) while the device structure in FIG. 1C has double epitaxial layers (Epi1 and Epi2, as illustrated in FIG. 1C, the Epi1 supported on a heavily doped substrate has a lower doping concentration than the Epi2 near a channel region). Due to the p type column structure and the n type column structure inter-diffusion, both the device structures in FIG. 1B and FIG. 1C do not have charges imbalance issue, resolving the technical limitation caused by the conventional super-junction trench MOSFET, however, the benefit of both the device structures in FIG. 1B and FIG. 1C over the conventional super-junction trench MOSFET only pronounces at the bias voltage ranging under 200V, which means that, the conventional super-junction trench MOSFET has a lower Rds when the bias voltage is beyond 200V.

Therefore, there is still a need in the art of the semiconductor power device, particularly for super-junction trench MOSFET design and fabrication, to provide a novel cell structure, device configuration that would resolve these difficulties and design limitations.

SUMMARY OF THE INVENTION

The present invention provides an N channel super junction trench MOSFET having a P type floating region formed underneath each gate trench and surrounding at least bottom of the gate trench, which having a body diode with faster reverse recovery characteristics as a result of a portion of holes flowing into the P type floating region and discharged during reverse recovery of the body diode. As an alternative, it can also be a P channel super-junction trench MOSFET having an N type floating region formed underneath each gate trench and surrounding at least bottom of the gate trench.

According to an aspect, the present invention features a super junction trench MOSFET comprising a plurality of unit cells with each unit cell in an active area comprising: a substrate of a first conductivity type; an epitaxial layer of the first conductivity type grown on the substrate, the epitaxial layer having a lower doping concentration than the substrate; a pair of deep trenches starting from a top surface of the epitaxial layer and down extending into the epitaxial layer; a mesa between the pair of deep trenches; a first doped column region of the first conductivity type with column shape within each the mesa; a body region of a second conductivity type in the mesa, covering a top surface of the first doped column region, extending between the pair of deep trenches; at least one gate trench filled with a gate electrode padded by a gate oxide layer, starting from the top surface of the epitaxial layer and down penetrating through the body region and extending into the first doped column in the mesa; multiple source-body contact openings with each filled with a contact metal plug extending into the body region in the mesa; a source region of the first conductivity type surrounding an upper portion of each the gate trench, extending between the upper portion of each the gate trench and sidewalls of adjacent source-body contact openings; and a floating region of the second conductivity type formed underneath each the gate trench and surrounding at least bottom of each the gate trench.

According to another aspect of the present invention, the super-junction trench MOSFET further comprising a pair of second doped column regions of the second conductivity type with column shape adjacent to sidewalls of the pair of deep trenches within the mesa, in parallel with and surrounding the first doped column region forming a first type charge balance area in conjunction with the first doped column region, wherein each of the deep trenches is filled with dielectric material comprising a buried void inside the dielectric material.

According to another aspect of the present invention, the super-junction trench MOSFET further comprising a pair of second doped column regions of the second conductivity type with column shape adjacent to sidewalls of the pair of deep trenches within the mesa, in parallel with and surrounding the first doped column region forming a first type charge balance area in conjunction with the first doped column region, wherein each of the deep trenches is filled with dielectric material without a buried void inside the dielectric material.

According to another aspect of the present invention, the super-junction trench MOSFET further comprising a pair of second doped column regions of the second conductivity type with column shape adjacent to sidewalls of the pair of deep trenches within the mesa, in parallel with and surrounding the first doped column region forming a first type charge balance area in conjunction with the first doped column region, wherein each of the deep trenches is filled with a shield electrode padded by a dielectric material layer, the shield electrode is connecting to a source metal of the super-junction trench MOSFET via the contact metal plug filled in each shield contact opening.

According to another aspect, the present invention features a super junction trench MOSFET wherein each of the deep trenches is filled with an epitaxial layer of the second conductivity type working as second doped column regions, the pair of deep trenches in parallel with and surrounding the first doped column region forming a first type charge balance area in conjunction with the first doped column region.

According to another aspect of the present invention, the super-junction trench MOSFET further comprising a first type guard ring connected with the source region, and multiple second type guard rings having floating voltage in a termination area, wherein the first type guard ring and the multiple second type floating guard rings all have junction depths greater than the body region; and the first type guard ring is connecting with a third doped column region of the second conductivity type and a fourth doped column region of the first conductivity type through a body region, the third doped column region and the fourth doped column region forming a second type charge balance area.

According to another aspect of the present invention, the super-junction trench MOSFET further comprising a termination area comprising a second type charge balance area consists of a third doped column region of the second conductivity type and a fourth doped column region of the first conductivity type along a deep trench, and a channel stop region formed near the top surface of the epitaxial layer with a doping concentration higher than the epitaxial layer, wherein the channel stop region has a termination contact opening filled with the contact metal plug penetrating through the channel stop region, wherein a body contact region of the second conductivity type is formed surrounding at least bottom of the termination contact opening with a higher doping concentration than the body region, wherein an equal potential ring metal is covering the contact metal plug filled in the termination contact opening in the termination area.

According to another aspect of the present invention, in some preferred embodiments, the third doped column region has about same column width as the second doped column region and the fourth doped column region has about half column width of the first doped column region in the unit cell.

According to another aspect of the present invention, in some preferred embodiments, the deep trenches further extend into the substrate, and the first doped column region reach a common interface between the substrate and the epitaxial layer; in some other preferred embodiments, trench bottoms of the deep trenches are above the substrate.

According to another aspect of the present invention, in some preferred embodiments, the super-junction trench MOSFET further comprising a body contact region of the second conductivity type within the body region and surrounding at least bottom of each the multiple source-body contact openings, wherein the body contact region has a higher doping concentration than the body region.

According to another aspect of the present invention, in some preferred embodiments, the contact metal plug is a tungsten plug padded by a barrier metal layer of Ti/TiN or Co/TiN or Ta/TiN.

According to another aspect of the present invention, in some preferred embodiments, the super-junction trench MOSFET further comprises at least one gate trench filled with the gate electrode padded by the gate oxide layer for gate connection which is connected to a gate metal via a gate contact opening filled with the contact metal plug.

According to another aspect of the present invention, in some preferred embodiments, the gate electrode is implemented by a poly-silicon layer.

According to another aspect of the present invention, in some preferred embodiments, the gate oxide layer has a thickness on trench bottom equal to or thinner than trench sidewalls of the gate trench.

According to another aspect of the present invention, in some preferred embodiments, the gate oxide layer has a thickness on trench bottom greater than trench sidewalls of the gate trench.

According to another aspect of the present invention, in some preferred embodiments, the gate electrode is formed in an upper portion of the gate trench, a shielded electrode padded by a shielded insulation layer is formed in a lower portion of the gate trench, the gate oxide layer has a thickness equal to or thinner than the shielded insulation layer on trench sidewalls of the gate trench.

According to another aspect of the present invention, in some preferred embodiments, the first conductivity type is N type and the second conductivity type is P type; in some other preferred embodiments, the first conductivity type is P type and the second conductivity type is N type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 3A is a cross-sectional view of a preferred embodiment according to the present invention.

FIG. 7C is a cross-sectional view of another preferred embodiment according to the present invention.

FIG. 8A is a cross-sectional view of another preferred embodiment according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
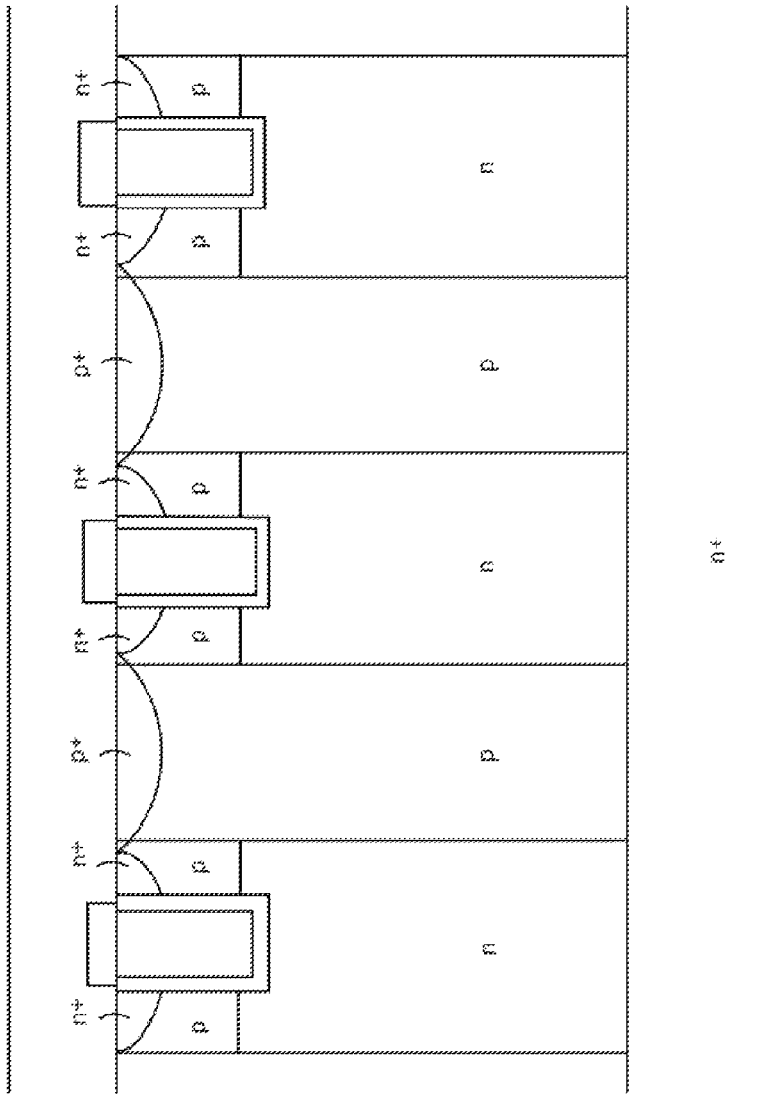
FIG. 1A is a cross-sectional view of a super-junction trench MOSFET of prior art.
Figure 1B:
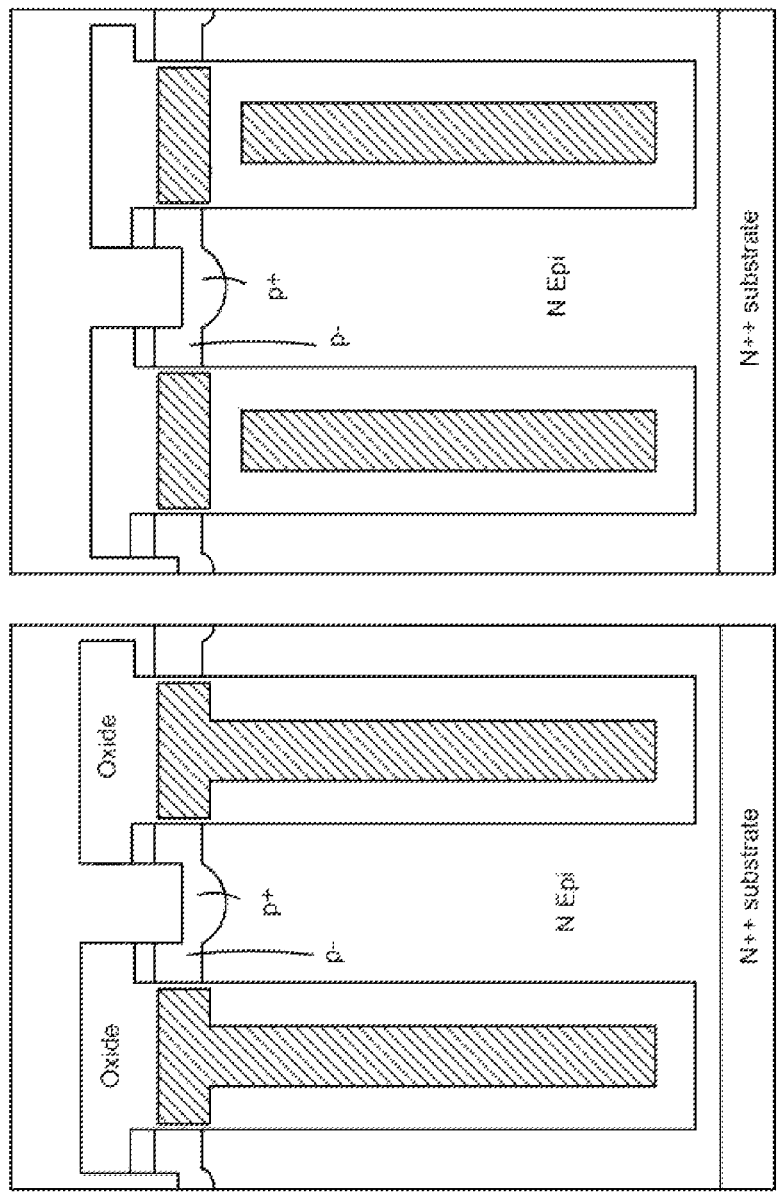
FIG. 1B is a cross-sectional view of a trench MOSFET of another prior art.
Figure 1C:
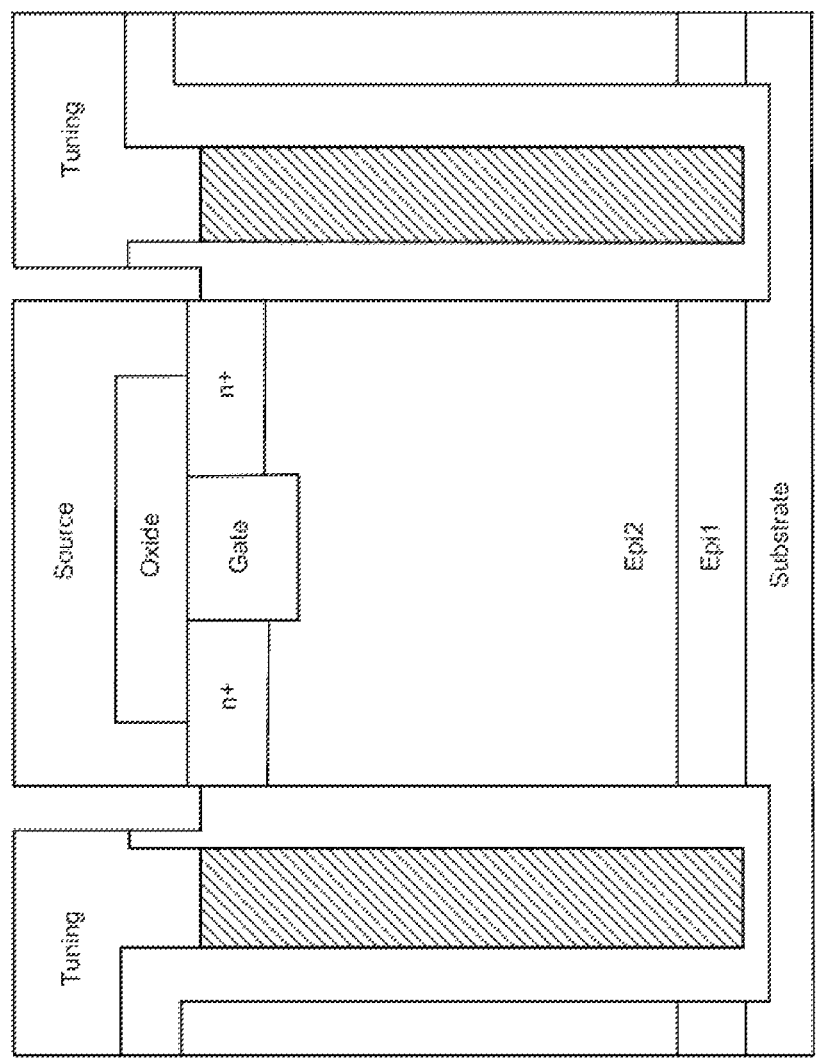
FIG. 1C is a cross-sectional view of a trench MOSFET of another prior art.
Figure 2:
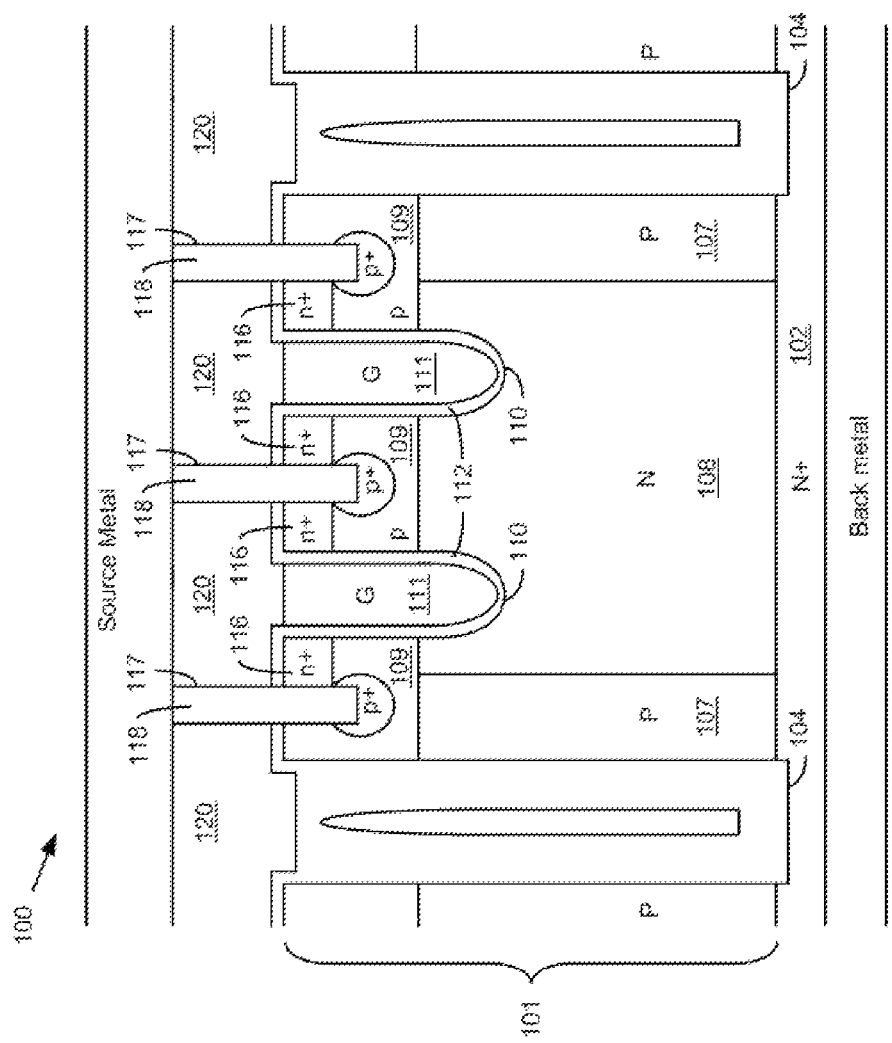
FIG. 2 is a cross-sectional view of a super-junction trench MOSFET disclosed in U.S. patent application Ser. No. 13/751,458 of the same inventor.

FIG. 2 shows a super-junction trench MOSFET 100 disclosed in U.S. patent application Ser. No. 13/751,458 of the same inventor, wherein an N-channel super-junction trench MOSFET 100 comprises a pair of deep trenches 104 formed starting form a top surface of an epitaxial layer 101 and vertically down extending, reaching an interface of the epitaxial 101 and a substrate 102. A mesa is therefore formed between the pair of the deep trenches 104 wherein an N first doped column region 108 is formed. Adjacent to sidewalls of the deep trenches 104, a pair of P second doped column regions 107 is formed in the mesa and in parallel surrounding with the N first doped column region 108. Onto a top surface of the N first doped column region 108 and the P second doped column regions 107, a p body region 109 is formed in the mesa extending between the pair of the deep trenches 104. Multiple gate trenches 110 is penetrating through the p body region 109 further extending into the N first doped column region 108, wherein each the gate trench 110 is filled with a gate electrode 111 padded by a gate oxide layer 112. Multiple source-body contact openings 117 each filled with a tungsten plug 118 are formed penetrating through the contact interlayer 120 and extending into the p body region 109, and an n+ source regions 116 is formed surrounding an upper portion of the gate trenches 110, extending between the upper portion of the gate trenches 110 and sidewalls of adjacent source-body contact openings 117. However, the demand for DC-DC converters, inverters, and the like is growing, and super-junction trench MOSFETs are required not only to have higher breakdown voltage and lower specific Rds, but also a body diode with superior reverse recovery characteristics.

Please refer to FIG. 3A for a preferred embodiment of this invention wherein an N-channel super-junction trench MOSFET 200 is formed in an epitaxial layer 201 supported onto an N+ substrate 202 which coated with a back metal 203 of Ti/Ni/Ag on its rear side as drain metal. The N-channel super junction trench MOSFET 200 comprises a plurality of unit cells with each comprising a pair of deep trenches 204 filled with dielectric material formed starting form a top surface of the epitaxial layer 201 and vertically down extending, reaching an interface of the epitaxial 201 and the substrate 202, wherein each of the deep trenches 204 comprises a buried void inside the dielectric material. As an alternative, trench bottoms of the deep trenches 204 are above the substrate 202. A mesa is therefore formed between the pair of the deep trenches 204 in each unit cell wherein an N first doped column region 208 is formed. Adjacent to sidewalls of the deep trenches 204, a pair of P second doped column regions 207 is formed in the mesa and in parallel surrounding with the N first doped column region 208 forming a first type charge balance area in conjunction with the N first doped column region 208. The N first doped column region 208 and the P second doped column regions 207 all have column bottoms above trench bottoms of the deep trenches 204. Onto a top surface of the N first doped column region 208 and the P second doped column regions 207, a p body region 209 is formed in the mesa extending between the pair of the deep trenches 204. Multiple gate trenches 210 are penetrating through the p body region 209 and further extending into the N first doped column region 208 in each unit cell, wherein the gate trenches 210 are filled with a gate electrode 211 padded by a gate oxide layer 212 having a thickness on trench bottom not greater than sidewalls of the gate trenches 210, wherein the gate electrode 211 is further connected to a gate metal (not shown) of the trench MOSFET 200 by extending to a gate trench (not shown) for gate connection. More preferred, the gate trench (not shown) for gate connection has a greater trench width than the gate trench 210. Onto a top surface of the gate electrodes 211, the contact interlayer 220 is formed to isolate the gate electrodes 211 from a source metal 213. In each the mesa, multiple source-body contact openings 217 with each filled with a contact metal plug 218 are formed penetrating through the contact interlayer 220 and extending into the p body region 209 in each unit cell, and an n+ source regions 216 is formed surrounding an upper portion of the gate trenches 210, extending between the upper portion of the gate trenches 210 and sidewalls of adjacent source-body contact openings 217. Therefore, the p body region 209 and the n+ source regions 216 are connected to the source metal 213 via the contact metal plugs 218 filled in the multiple source-body contact openings 217. In this preferred embodiment, all the contact metal plugs can be implemented by using a tungsten plug padded by a barrier metal layer of Ti/TiN or Co/TiN or Ta/TiN, and the gate electrodes 211 can be implemented by using a poly-silicon layer. A p+ body contact region 221 is formed surrounding at least bottom of each the source-body contact opening 217 to reduce the contact resistance between the contact metal plugs 218 and the p body region 209. Furthermore, a P type floating region 230 ("Pf", as illustrated in FIG. 3A) is formed underneath each the gate trench 210 and surrounding at least bottom of each the gate trench 210. STM (scanning tunneling microscope) with the P type floating region has faster reverse recovery characteristics of a parasitic body diode as a result of a portion of holes flowing into the P type floating region 230 and discharged during reverse recovery of the parasitic body diode.

Figure 3B:
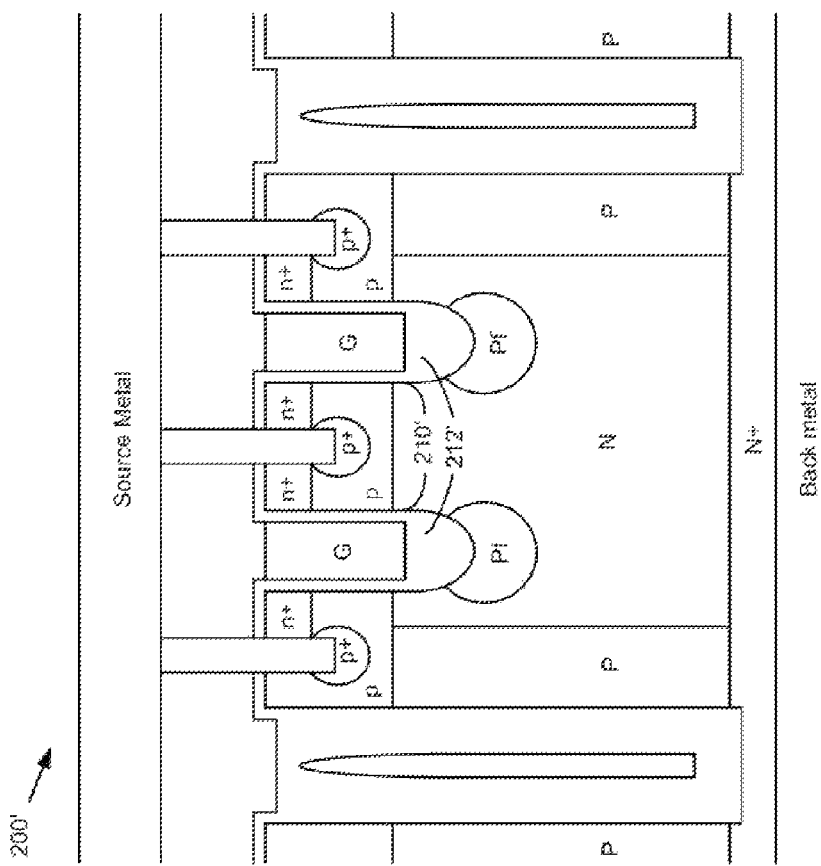
FIG. 3B is a cross-sectional view of another preferred embodiment according to the present invention.

FIG. 3B shows a cross-sectional view of another preferred N-channel super-junction trench MOSFET 200' according to the present invention, which is similar to the super-junction trench MOSFET 200 in FIG. 3A except that in FIG. 3B, the gate oxide layer 212' has a thickness on trench bottom greater than trench sidewalls of the gate trench 210'.

Figure 3C:
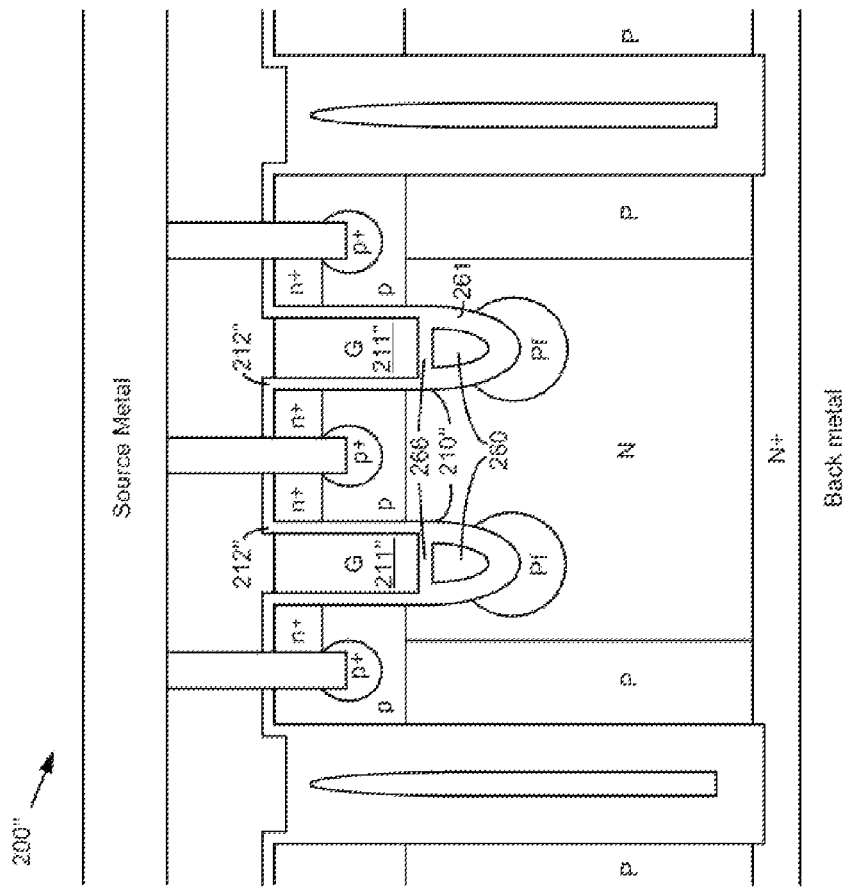
FIG. 3C is a cross-sectional view of another preferred embodiment according to the present invention.

FIG. 3C shows a cross-sectional view of another preferred N-channel super-junction trench MOSFET 200" according to the present invention, which is similar to the super-junction trench MOSFET 200 in FIG. 3A except that in FIG. 3C, the gate electrode 211" is formed in an upper portion of the gate trench 210", a shielded electrode 260 padded by a shielded insulation layer 261 is formed in a lower portion of the gate trench 210", wherein the gate oxide layer 212" has a thickness equal to or thinner than the shielded insulation layer 261 on trench sidewalls of the gate trench 210", the gate electrode 211" and the shielded electrode 260 are insulated from each other by an inter-insulation layer 266. More preferred, the shielded electrode 260 is connected to the source metal of the super-junction trench MOSFET 200.

Figure 4A:
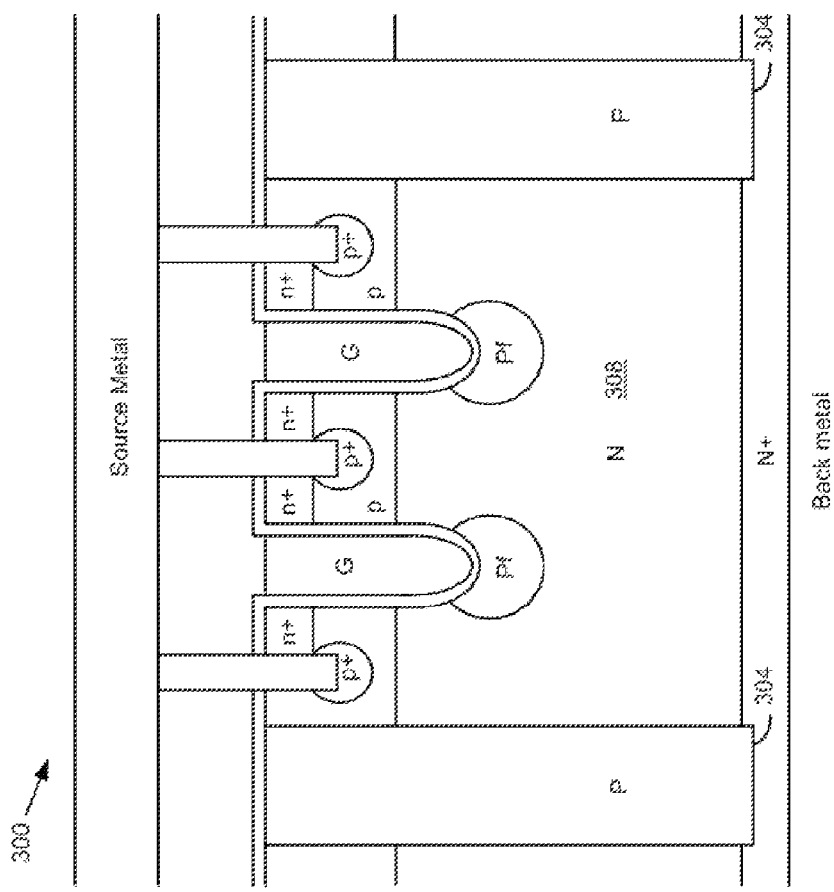
FIG. 4A is a cross-sectional view of another preferred embodiment according to the present invention.

FIG. 4A shows a cross-sectional view of another preferred N-channel super-junction trench MOSFET 300 according to the present invention, which is similar to the super-junction trench MOSFET 200 in FIG. 3A except that, the deep trenches 304 are filled with a P type epitaxial layer, therefore, the deep trenches 304 also work as P second doped column regions. Moreover, an N first doped column region 308 with column shape is formed between the pair of deep trenches 304 wherein the pair of deep trenches 304 in parallel with and surrounding the N first doped column region 308 forming a first type charge balance area in conjunction with the N first doped column region 308.

Figure 4B:
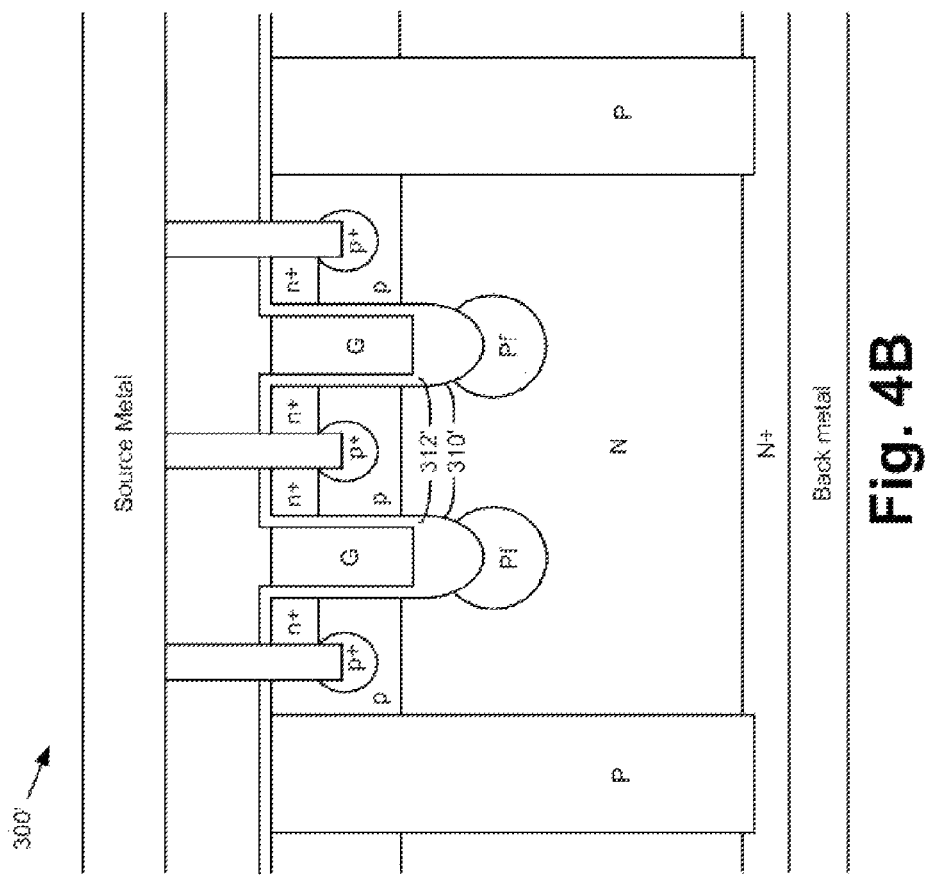
FIG. 4B is a cross-sectional view of another preferred embodiment according to the present invention.

FIG. 4B shows a cross-sectional view of another preferred N-channel super-junction trench MOSFET 300' according to the present invention, which is similar to the super-junction trench MOSFET 300 in FIG. 4A except that in FIG. 4B, the gate oxide layer 312' has a thickness on trench bottom greater than trench sidewalls of the gate trench 310'.

Figure 4C:
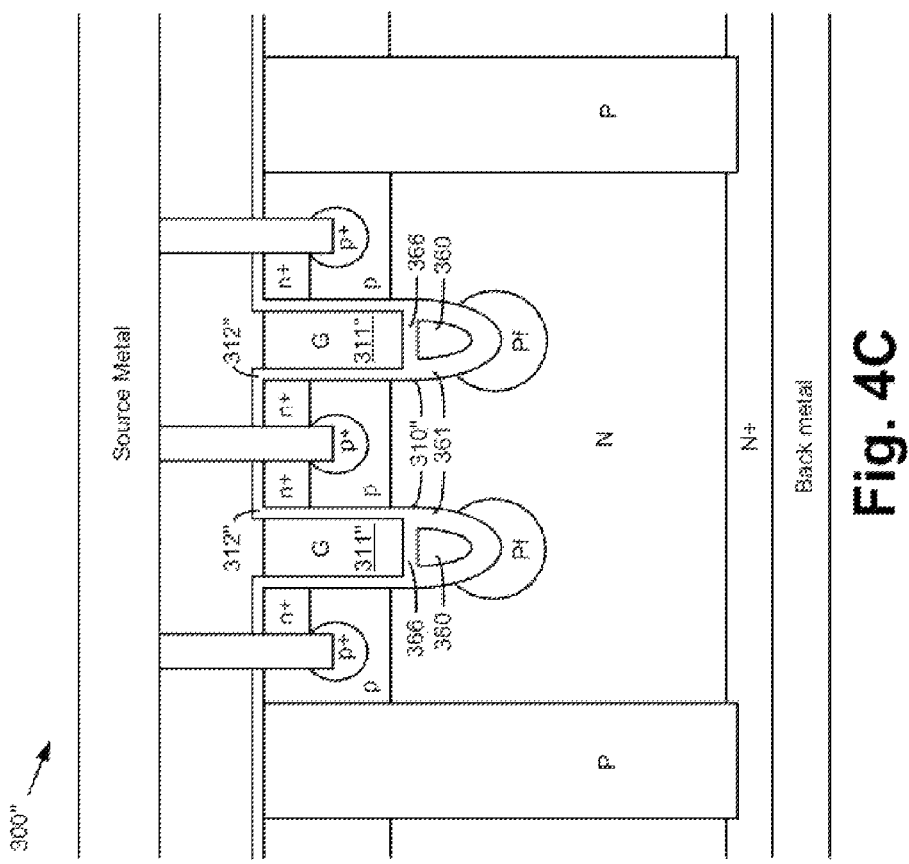
FIG. 4C is a cross-sectional view of another preferred embodiment according to the present invention.

FIG. 4C shows a cross-sectional view of another preferred N-channel super-junction trench MOSFET 300" according to the present invention, which is similar to the super-junction trench MOSFET 300 in FIG. 4A except that in FIG. 4C, the gate electrode 311" is formed in an upper portion of the gate trench 310", a shielded electrode 360 padded by a shielded insulation layer 361 is formed in a lower portion of the gate trench 310", wherein the gate oxide layer 312" has a thickness equal to or thinner than the shielded insulation layer 361 on trench sidewalls of the gate trench 310", the gate electrode 311" and the shielded electrode 360 are insulated from each other by an inter-insulation layer 366. More preferred, the shielded electrode 360 is connected to the source metal of the super-junction trench MOSFET 300".

Figure 5A:
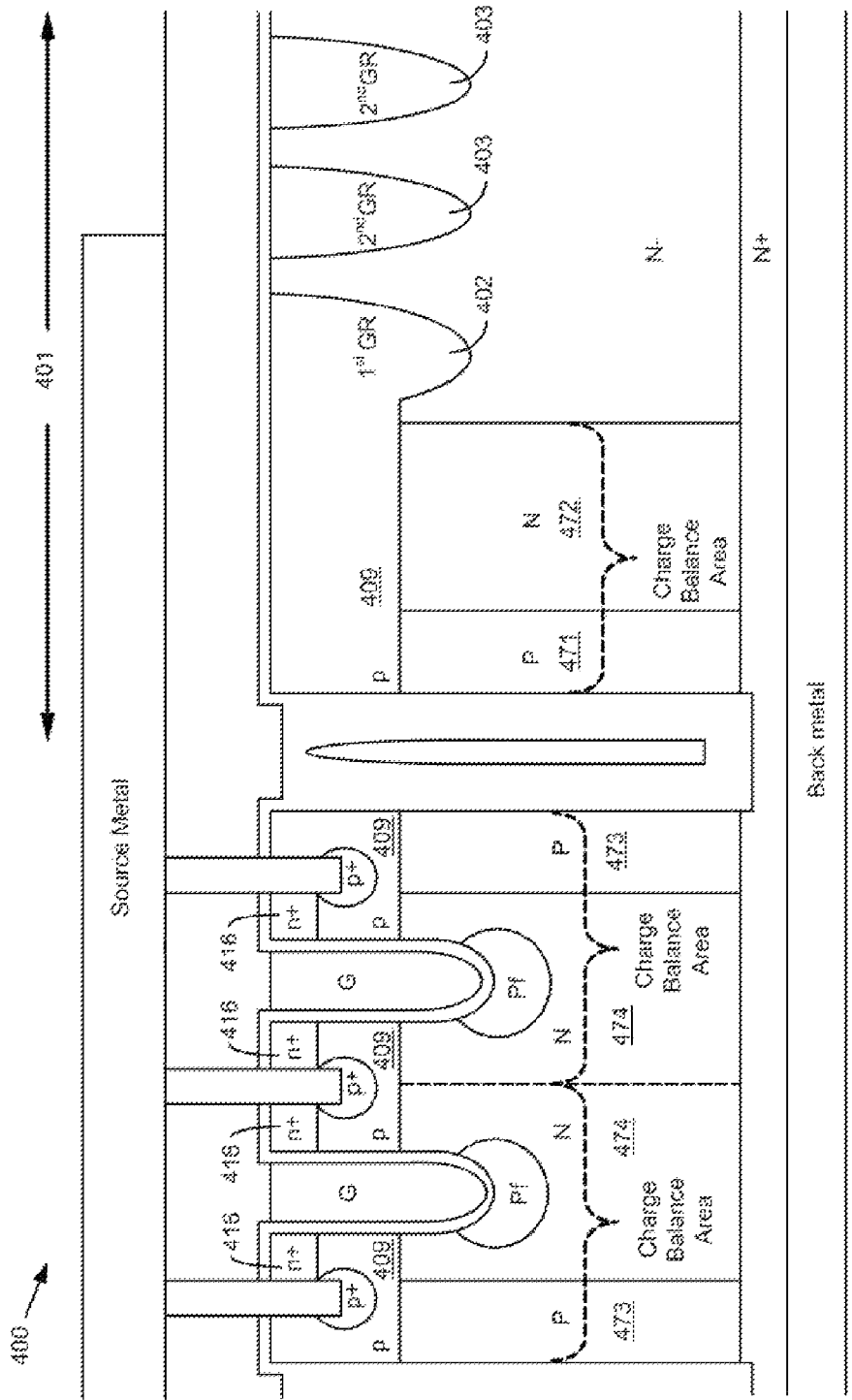
FIG. 5A is a cross-sectional view of another preferred embodiment according to the present invention.

FIG. 5A shows a cross-sectional view of another preferred super-junction trench MOSFET 400 according to the present invention which has a similar structure as the super-junction trench MOSFET 200 in FIG. 3A, except that, the N-channel trench MOSFET 400 in FIG. 5A further comprises a termination area 401 including multiple guard rings, among which a first type guard ring 402 ($1^{st}$ GR, as illustrated in FIG. 5A) is connected with the n+ source region 416, and second type guard rings 403 ($2^{nd}$ GR, as illustrated in FIG. 5A) are floating guard rings which have floating voltage in the termination area 401, wherein the first type guard ring 402 and the second type guard rings 403 all have junction depths greater than the p body region 409. Moreover, the first type guard ring 402 is connecting with a P third doped column region 471 and an N fourth doped column region 472 through a body region 409 in the termination area wherein the P third doped column region 471 has about same column width as the second doped column region 473 and the N fourth doped column region 472 has about half column width of the first doped column region 474 in the unit cell, the P third doped column region 471 and the N fourth doped column region 472 forming a second type charge balance area.

Figure 5B:
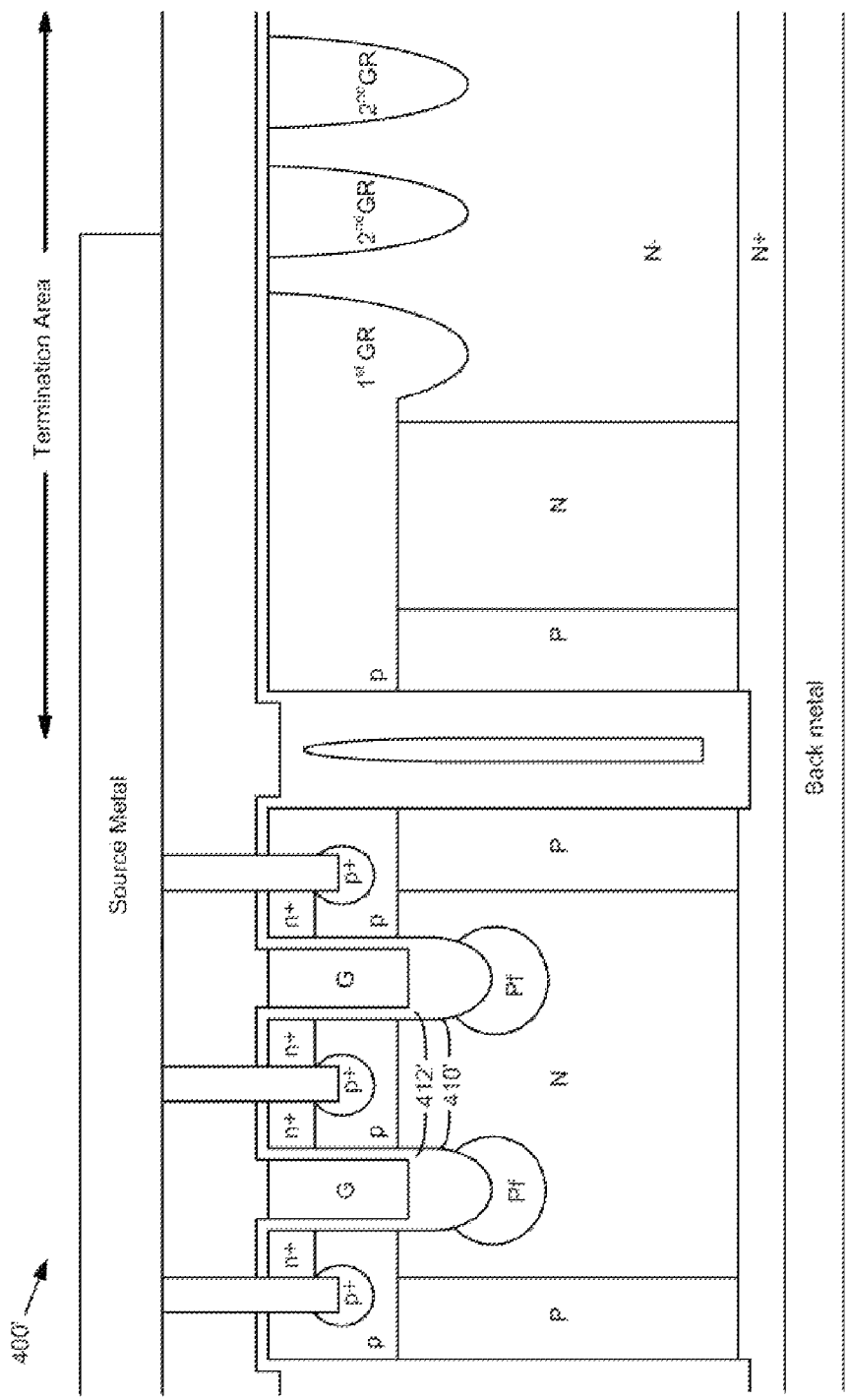
FIG. 5B is a cross-sectional view of another preferred embodiment according to the present invention.

FIG. 5B shows a cross-sectional view of another preferred N-channel super-junction trench MOSFET 400' according to the present invention, which is similar to the super-junction trench MOSFET 400 in FIG. 5A except that in FIG. 5B, the gate oxide layer 412' has a thickness on trench bottom greater than trench sidewalls of the gate trench 410'.

Figure 5C:
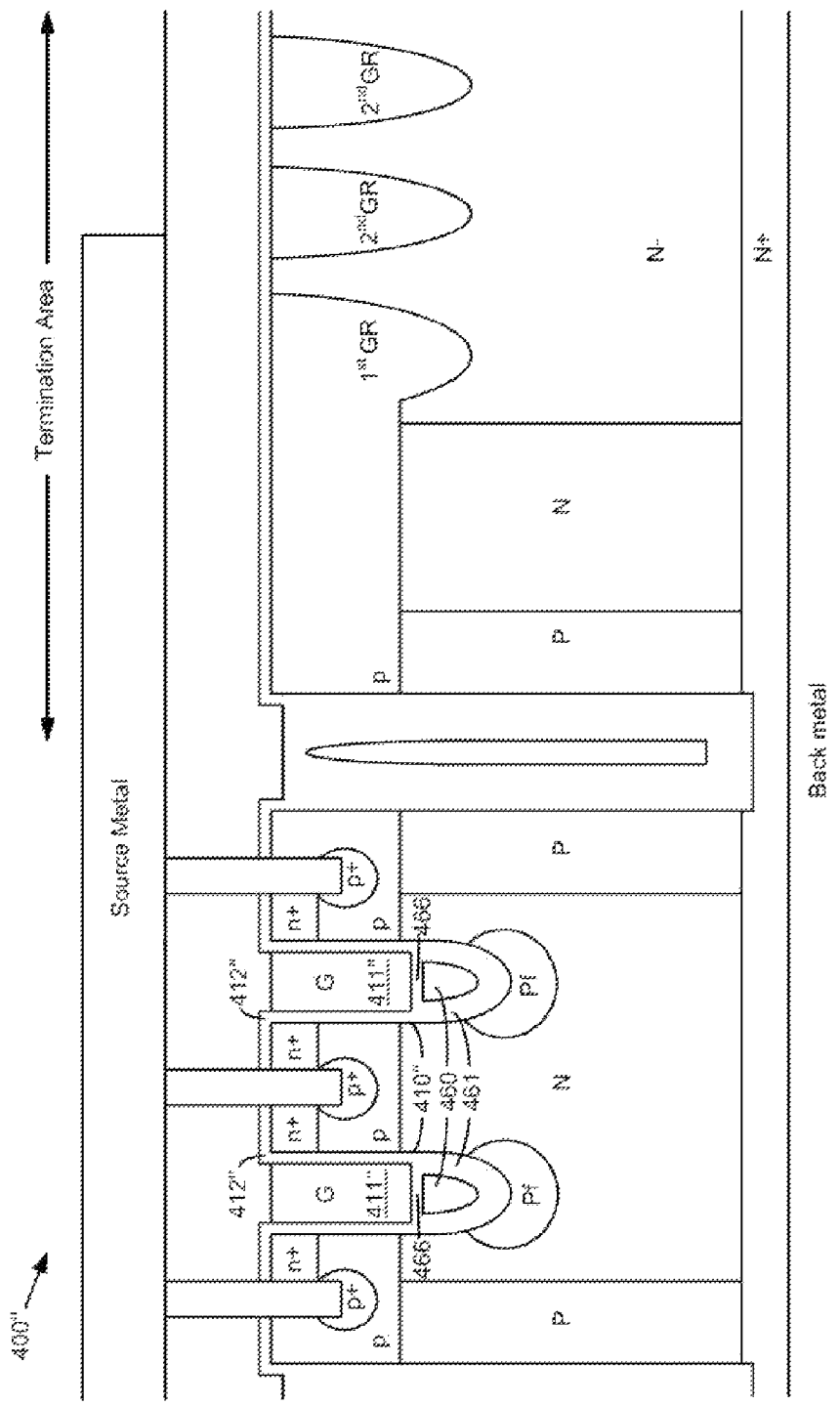
FIG. 5C is a cross-sectional view of another preferred embodiment according to the present invention.

FIG. 5C shows a cross-sectional view of another preferred N-channel super-junction trench MOSFET 400" according to the present invention, which is similar to the super-junction trench MOSFET 400 in FIG. 5A except that in FIG. 5C, the gate electrode 411" is formed in an upper portion of the gate trench 410", a shielded electrode 460 padded by a shielded insulation layer 461 is formed in a lower portion of the gate trench 410", wherein the gate oxide layer 412" has a thickness equal to or thinner than the shielded insulation layer 461 on trench sidewalls of the gate trench 410", the gate electrode 411" and the shielded electrode 460 are insulated from each other by an inter-insulation layer 466. More preferred, the shielded electrode 460 is connected to the source metal of the super-junction trench MOSFET 400".

Figure 6A:
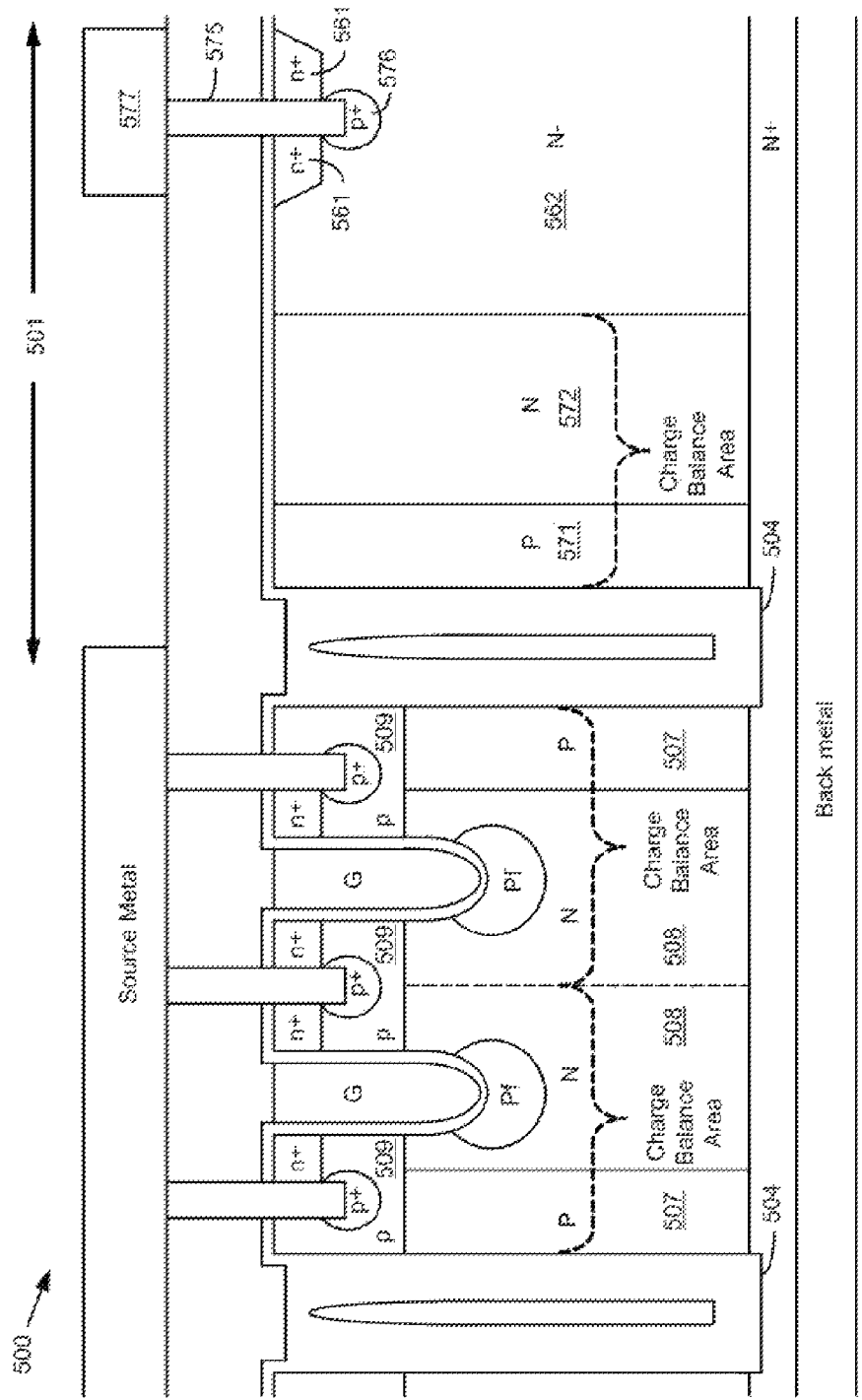
FIG. 6A is a cross-sectional view of another preferred embodiment according to the present invention.

FIG. 6A shows a cross-sectional view of another preferred super-junction trench MOSFET 500 according to the present invention which has a similar structure as the super-junction trench MOSFET 200 in FIG. 3A, except that, the N-channel trench MOSFET 500 in FIG. 6A further comprises a short termination area 501 including a second type charge balance area consists of a P third doped column region 571 and an N fourth doped column region 572 along a deep trench 504, and an n+ channel stop region 561 formed near a top surface of an epitaxial layer 562 with a doping concentration higher than the epitaxial layer 562, wherein the P third doped column region 571 has about same column width as the P second doped column region 507 and the N fourth doped column region 572 has about half column width of the N first doped column region 508 in the unit cell, the n+ channel stop region 561 has a termination contact opening 575 filled with the contact metal plug penetrating through the n+ channel stop region 561, wherein a p+ body contact region 576 is formed surrounding at least bottom of the termination contact opening 575 with a higher doping concentration than the body region 509, wherein an equal potential ring metal 577 is covering the contact metal plug filled in the termination contact opening 575 in the termination area 501.

Figure 6B:
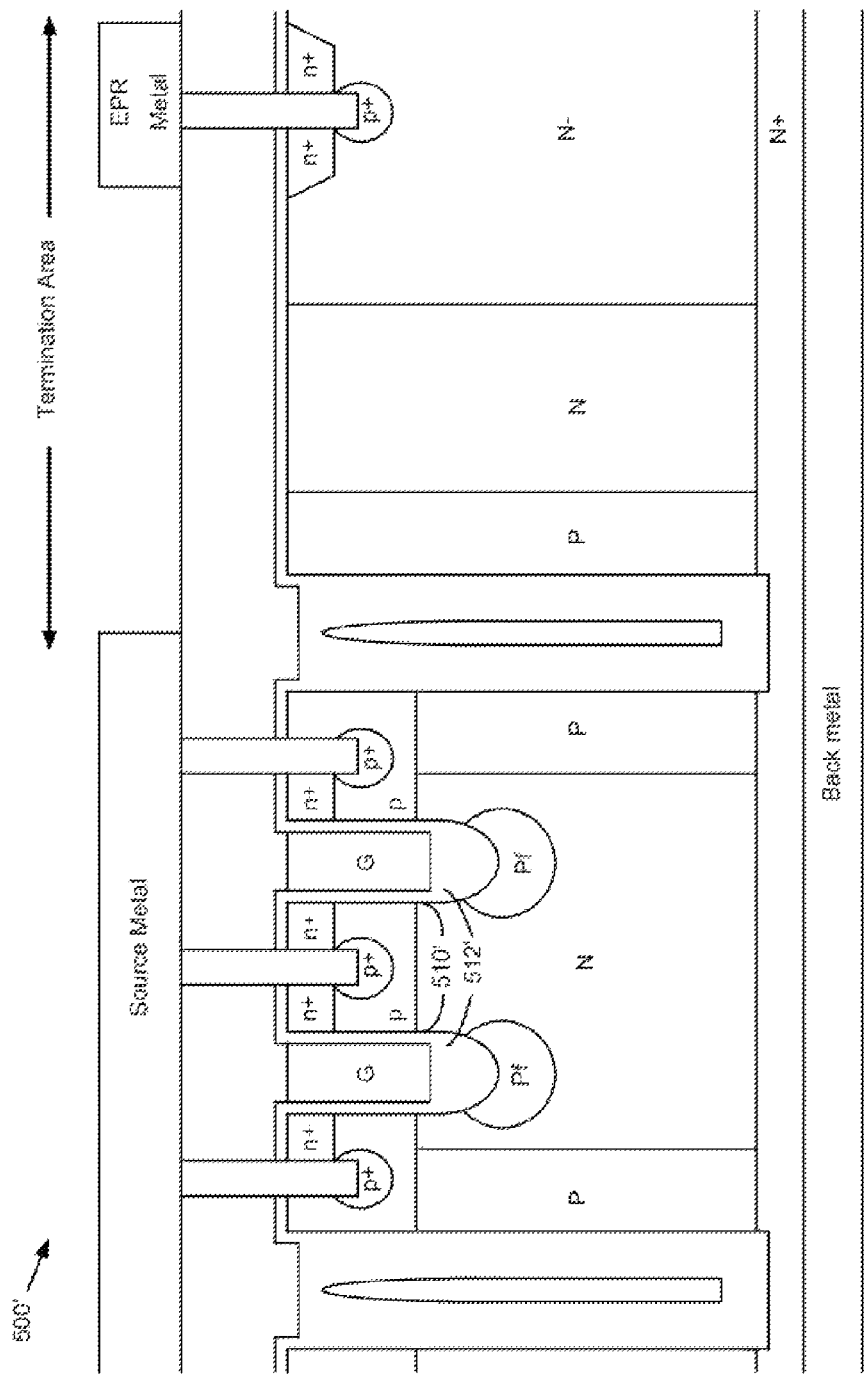
FIG. 6B is a cross-sectional view of another preferred embodiment according to the present invention.

FIG. 6B shows a cross-sectional view of another preferred N-channel super-junction trench MOSFET 500' according to the present invention, which is similar to the super-junction trench MOSFET 500 in FIG. 6A except that in FIG. 6B, the gate oxide layer 512' has a thickness on trench bottom greater than trench sidewalls of the gate trench 510'.

Figure 6C:
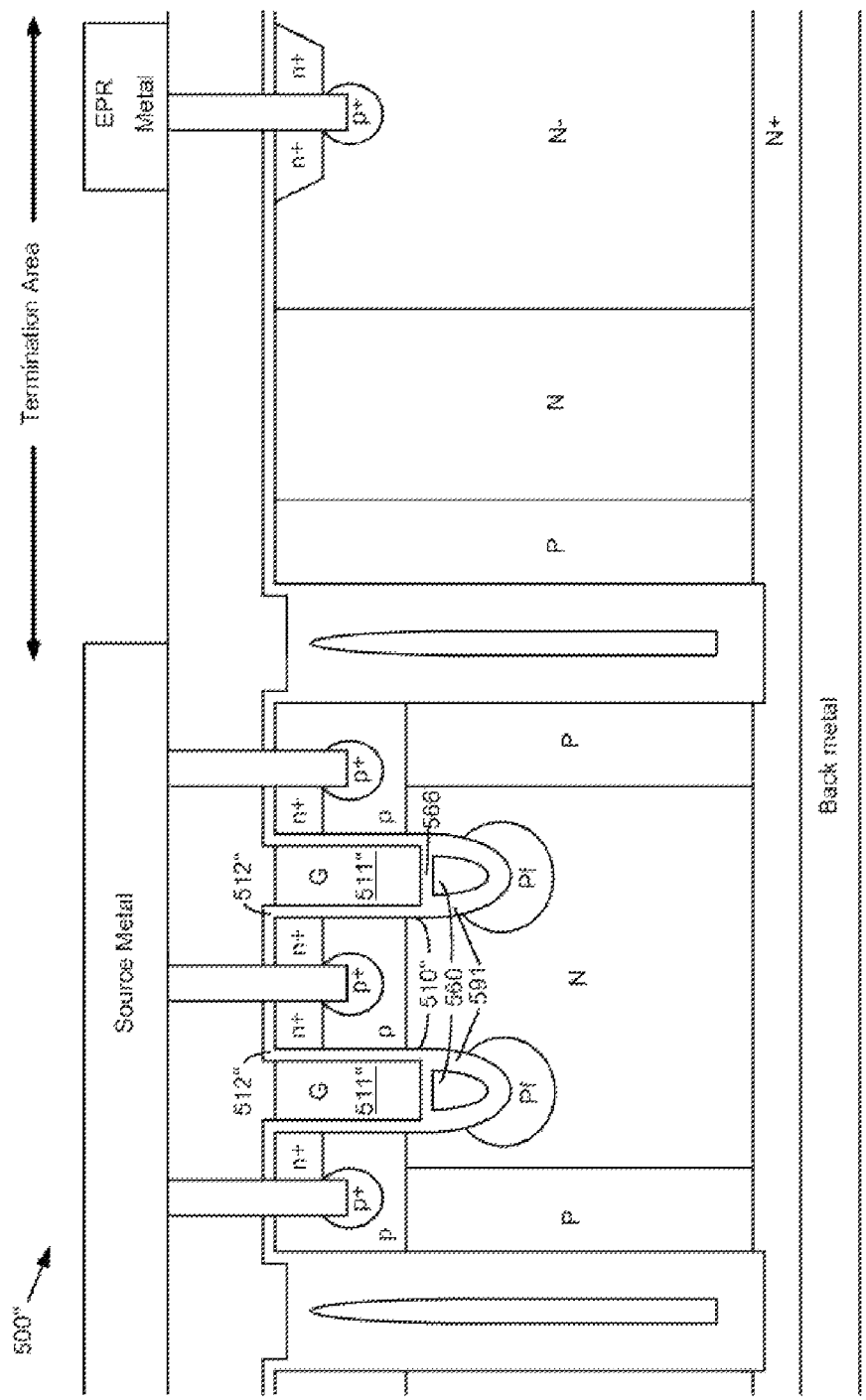
FIG. 6C is a cross-sectional view of another preferred embodiment according to the present invention.

FIG. 6C shows a cross-sectional view of another preferred N-channel super-junction trench MOSFET 500" according to the present invention, which is similar to the super-junction trench MOSFET 500 in FIG. 6A except that in FIG. 6C, the gate electrode 511" is formed in an upper portion of the gate trench 510", a shielded electrode 560 padded by a shielded insulation layer 591 is formed in a lower portion of the gate trench 510", wherein the gate oxide layer 512" has a thickness equal to or thinner than the shielded insulation layer 591 on trench sidewalls of the gate trench 510", the gate electrode 511" and the shielded electrode 560 are insulated from each other by an inter-insulation layer 566. More preferred, the shielded electrode 560 is connected to the source metal of the super-junction trench MOSFET 500".

Figure 7A:
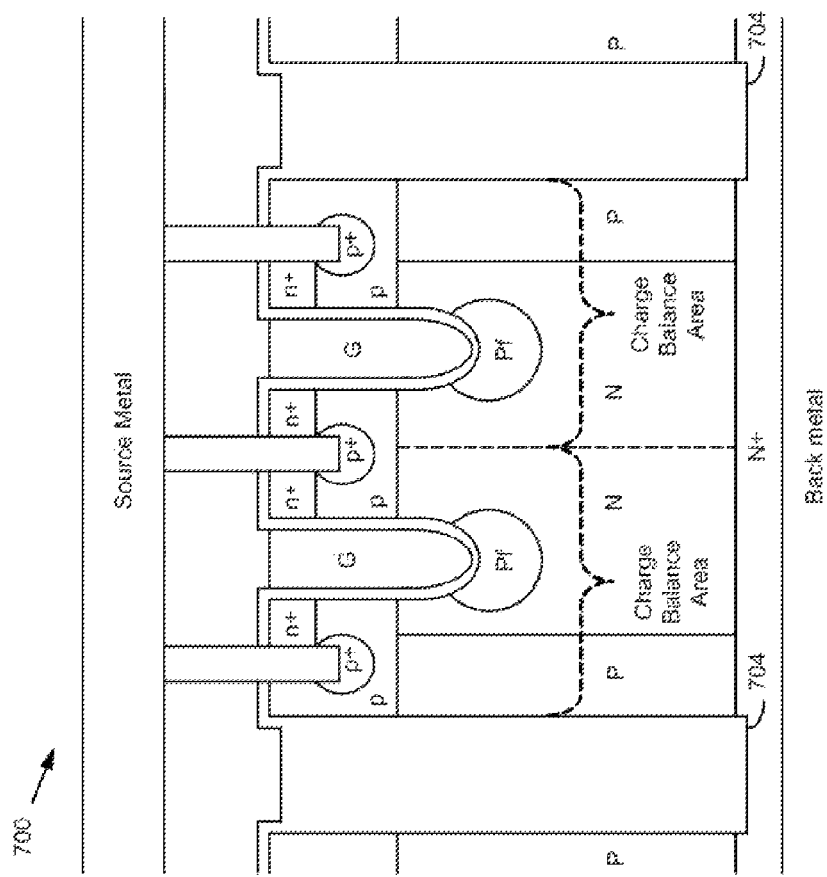
FIG. 7A is a cross-sectional view of another preferred embodiment according to the present invention.

FIG. 7A shows a cross-sectional view of another preferred N-channel super-junction trench MOSFET 700 according to the present invention, which is similar to the super-junction trench MOSFET 200 in FIG. 3A except that, the deep trenches 704 are filled with dielectric material without a buried void inside the dielectric material.

Figure 7B:
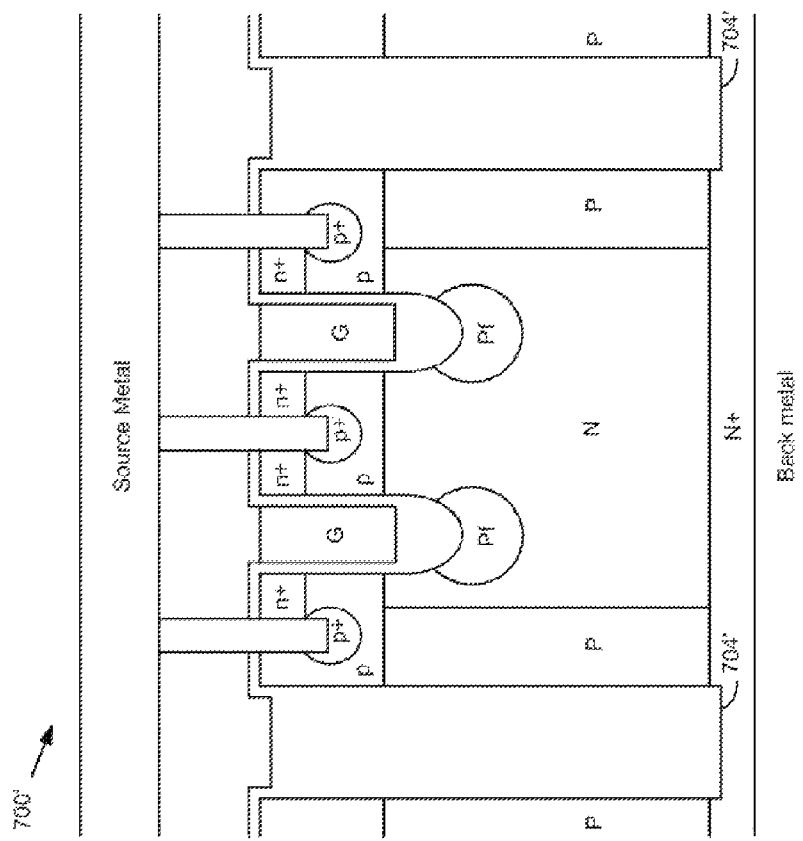
FIG. 7B is a cross-sectional view of another preferred embodiment according to the present invention.

FIG. 7B shows a cross-sectional view of another preferred N-channel super-junction trench MOSFET 700' according to the present invention, which is similar to the super-junction trench MOSFET 200' in FIG. 3B except that, the deep trenches 704' are filled with dielectric material without a buried void inside the dielectric material.

FIG. 7C shows a cross-sectional view of another preferred N-channel super-junction trench MOSFET 700" according to the present invention, which is similar to the super-junction trench MOSFET 200" in FIG. 3C except that, the deep trenches 704" are filled with dielectric material without a buried void inside the dielectric material.

FIG. 8A shows a cross-sectional view of another preferred N-channel super-junction trench MOSFET 800 according to the present invention, which is similar to the super-junction trench MOSFET 200 in FIG. 3A except that, each of the deep trenches 804 is filled with a shield electrode 880 padded by a dielectric material layer 881, the shield electrode 880 is connecting to a source metal 813 of the super-junction trench MOSFET 800 via the contact metal plug 882 filled in each shield contact opening 883.

Figure 8B:
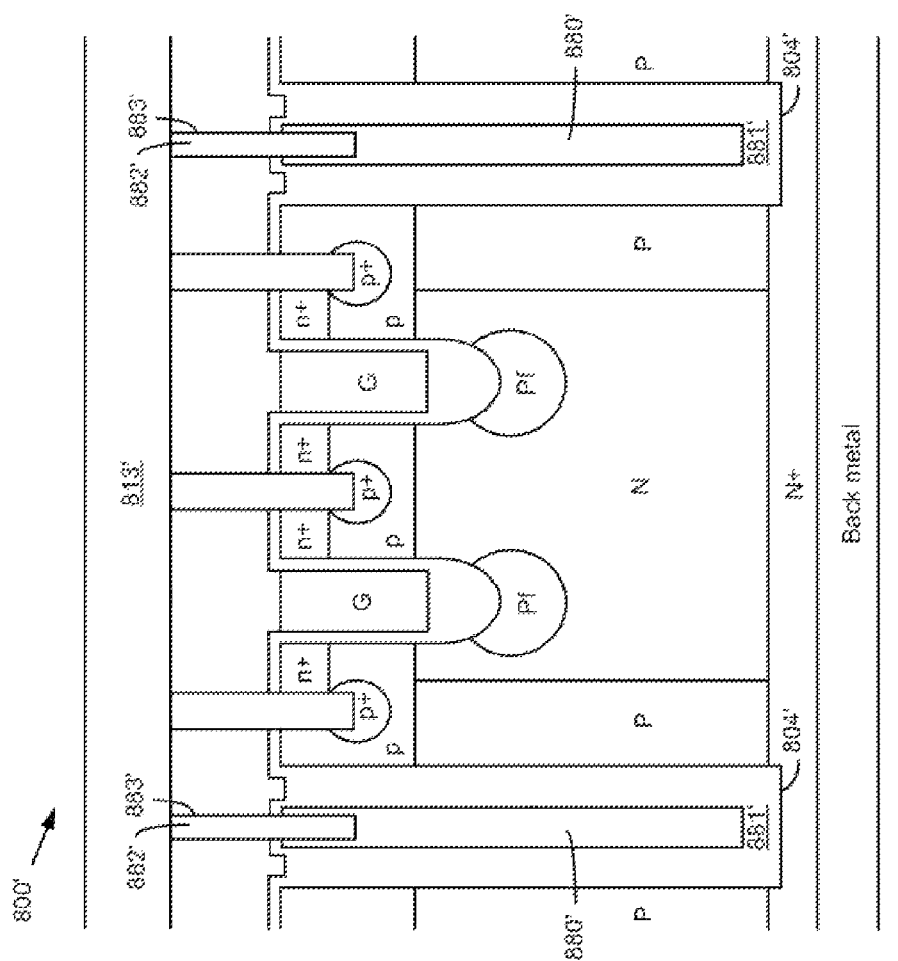
FIG. 8B is a cross-sectional view of another preferred embodiment according to the present invention.

FIG. 8B shows a cross-sectional view of another preferred N-channel super-junction trench MOSFET 800' according to the present invention, which is similar to the super-junction trench MOSFET 200' in FIG. 3B except that, each of the deep trenches 804' is filled with a shield electrode 880' padded by a dielectric material layer 881', the shield electrode 880' is connecting to a source metal 813' of the super-junction trench MOSFET 800' via the contact metal plug 882' filled in each shield contact opening 883'.

Figure 8C:
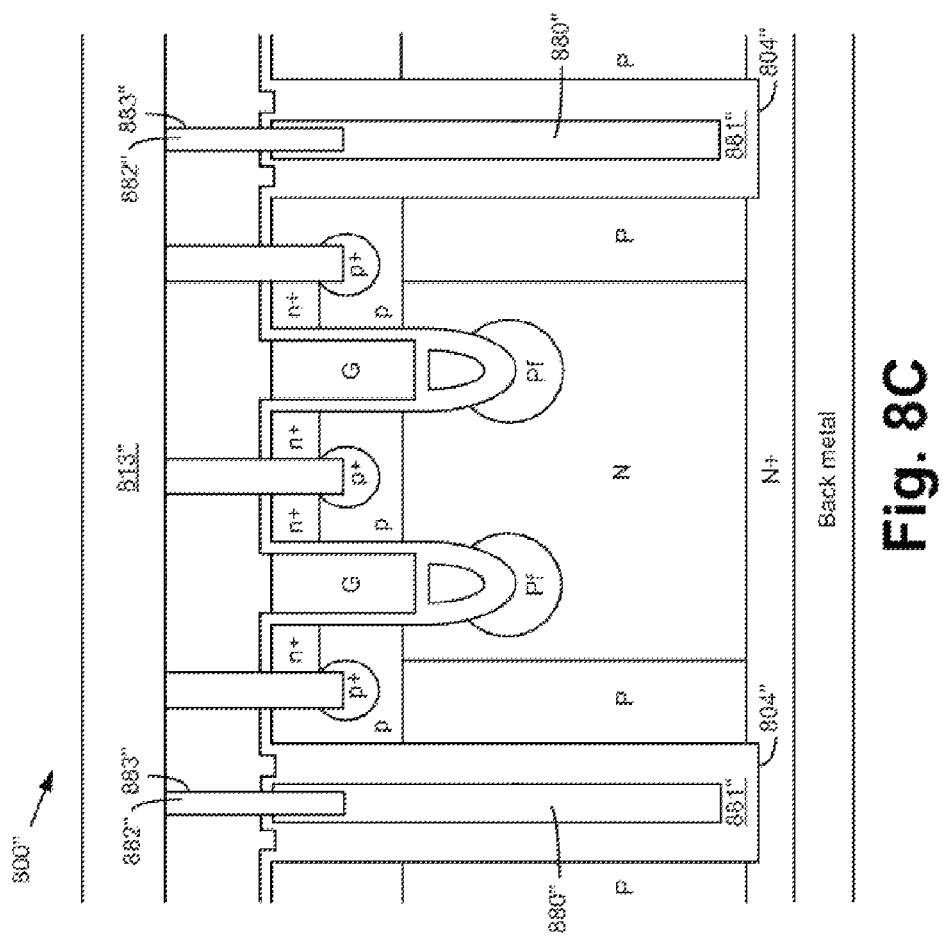
FIG. 8C is a cross-sectional view of another preferred embodiment according to the present invention.

FIG. 8C shows a cross-sectional view of another preferred N-channel super-junction trench MOSFET 800" according to the present invention, which is similar to the super-junction trench MOSFET 200" in FIG. 3C except that, each of the deep trenches 804" is filled with a shield electrode 880" padded by a dielectric material layer 881", the shield electrode 880" is connecting to a source metal 813" of the super-junction trench MOSFET 800" via the contact metal plug 882" filled in each shield contact opening 883".

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A super-junction trench MOSFET comprising a plurality of unit cells with each unit cell in an active area comprising:
    a substrate of a first conductivity type;
    an epitaxial layer of said first conductivity type grown on said substrate, said epitaxial layer having a lower doping concentration than said substrate;
    a pair of deep trenches starting from a top surface of said epitaxial layer and down extending into said epitaxial layer;
    a mesa between said pair of deep trenches;
    a first doped column region of said first conductivity type with column shape within each said mesa;
    a body region of a second conductivity type in said mesa, covering a top surface of said first doped column region, extending between said pair of deep trenches;
    at least one gate trench filled with a gate electrode padded by a gate oxide layer, starting from the top surface of said epitaxial layer and down penetrating through said body region and extending into said first doped column in said mesa;
    multiple source-body contact openings with each filled with a contact metal plug extending into said body region in said mesa;
    a source region of said first conductivity type surrounding an upper portion of each said gate trench, extending between the upper portion of each said gate trench and sidewalls of adjacent source-body contact openings; and
    a floating region of said second conductivity type formed underneath each said gate trench and surrounding at least bottom of each said gate trench.

2. The super-junction trench MOSFET of claim 1 further comprising a pair of second doped column regions of said second conductivity type with column shape adjacent to sidewalls of said pair of deep trenches within said mesa, in parallel with and surrounding said first doped column region forming a first type charge balance area in conjunction with said first doped column region, wherein each of said deep trenches is filled with dielectric material comprising a buried void inside said dielectric material.

3. The super-junction trench MOSFET of claim 1 further comprising a pair of second doped column regions of said second conductivity type with column shape adjacent to sidewalls of said pair of deep trenches within said mesa, in parallel with and surrounding said first doped column region forming a first type charge balance area in conjunction with said first doped column region, wherein each of said deep trenches is filled with dielectric material without a buried void inside said dielectric material.

4. The super-junction trench MOSFET of claim 1 further comprising a pair of second doped column regions of said second conductivity type with column shape adjacent to sidewalls of said pair of deep trenches within said mesa, in parallel with and surrounding said first doped column region forming a first type charge balance area in conjunction with said first doped column region, wherein each of said deep trenches is filled with a shield electrode padded by a dielectric material layer, said shield electrode is connecting to a source metal of said super-junction trench MOSFET via the contact metal plug filled in each shield contact opening.

5. The super-junction trench MOSFET of claim 1, wherein each of said deep trenches is filled with an epitaxial layer of said second conductivity type working as second doped column regions, said pair of deep trenches in parallel with and surrounding said first doped column region forming a first type charge balance area in conjunction with said first doped column region.

6. The super-junction trench MOSFET of claim 1, wherein said deep trenches further extend into said substrate, and said first doped column region reach a common interface between said substrate and said epitaxial layer.

7. The super junction trench MOSFET of claim 1, wherein trench bottoms of said deep trenches are above said substrate.

8. The super-junction trench MOSFET of claim 1 further comprising a body contact region of said second conductivity type within said body region and surrounding at least bottom of each said multiple source-body contact openings, wherein said body contact region has a higher doping concentration than said body region.

9. The super-junction trench MOSFET of claim 1, wherein said contact metal plug is a tungsten plug padded by a barrier metal layer of Ti/TiN or Co/TiN or Ta/TiN.

10. The super junction trench MOSFET of claim 1, wherein said gate electrode is connected to a gate metal via a gate contact opening filled with said contact metal plug.

11. The super junction trench MOSFET of claim 1, wherein said gate electrode is implemented by a poly-silicon layer.

12. The super-junction trench MOSFET of claim 1, wherein said gate oxide layer has a thickness on trench bottom equal to or thinner than trench sidewalls of said gate trench.

13. The super-junction trench MOSFET of claim 1, wherein said gate oxide layer has a thickness on trench bottom greater than trench sidewalls of said gate trench.

14. The super-junction trench MOSFET of claim 1, wherein said gate electrode is formed in an upper portion of said gate trench, a shielded electrode padded by a shielded insulation layer is formed in a lower portion of said gate trench and isolated from said gate electrode by an inter-insulation layer, said gate oxide layer has a thickness equal to or thinner than said shielded insulation layer on trench sidewalls of said gate trench.

15. The super-junction trench MOSFET of claim 1 further comprising a first type guard ring connected with said source region, and multiple second type guard rings having floating voltage in a termination area, wherein said first type guard ring and said multiple second type floating guard rings all have junction depths greater than said body region; and said first type guard ring is connecting with a third doped column region of said second conductivity type and a fourth doped column region of said first conductivity type through a body region, said third doped column region and said fourth doped column region forming a second type charge balance area.

16. The super junction trench MOSFET of claim 15, wherein said third doped column region has about same column width as said second doped column region and said fourth doped column region has about half column width of said first doped column region in said unit cell.

17. The super-junction trench MOSFET of claim 1 further comprising a termination area comprising a second type charge balance area consists of a third doped column region of said second conductivity type and a fourth doped column region of said first conductivity type along a deep trench, and a channel stop region of said first conductivity type formed near the top surface of said epitaxial layer with a doping concentration higher than said epitaxial layer, wherein said channel stop region has a termination contact opening filled with said contact metal plug penetrating through said channel stop region, wherein a body contact region of said second conductivity type is formed surrounding at least bottom of said termination contact opening with a higher doping concentration than said body region, wherein an equal potential ring metal is covering said contact metal plug filled in said termination contact opening in said termination area.

18. The super junction trench MOSFET of claim 17, wherein said third doped column region has about same column width as said second doped column region and said fourth doped column region has about half column width of said first doped column region in said unit cell.

\* \* \* \* \*